(12) United States Patent
Iwagami

(10) Patent No.: US 11,284,501 B2
(45) Date of Patent: Mar. 22, 2022

(54) CIRCUIT BOARD, MOTOR, CONTROLLER, AND ELECTRIC PUMP

(71) Applicant: Nidec Corporation, Kyoto (JP)

(72) Inventor: Naoki Iwagami, Kawasaki (JP)

(73) Assignee: NIDEC CORPORATION, Kyoto (JP)

( * ) Notice: Subject to any disclaimer, the term of this patent is extended or adjusted under 35 U.S.C. 154(b) by 423 days.

(21) Appl. No.: 16/479,292

(22) PCT Filed: Feb. 22, 2018

(86) PCT No.: PCT/JP2018/006558
§ 371 (c)(1),
(2) Date: Jul. 19, 2019

(87) PCT Pub. No.: WO2018/155585
PCT Pub. Date: Aug. 30, 2018

(65) Prior Publication Data
US 2019/0380196 A1    Dec. 12, 2019

(30) Foreign Application Priority Data

Feb. 24, 2017  (JP) ............................. JP2017-033856

(51) Int. Cl.
*H05K 1/02*         (2006.01)
*H02K 11/27*        (2016.01)
(Continued)

(52) U.S. Cl.
CPC .......... *H05K 1/0206* (2013.01); *F04B 35/04* (2013.01); *H02K 5/20* (2013.01); *H02K 9/19* (2013.01);
(Continued)

(58) Field of Classification Search
CPC ................... H02K 9/22; H02K 11/33; H05K 2201/10416; H05K 1/0206; H05K 1/115; H05K 1/181; H05K 7/209
(Continued)

(56) References Cited

U.S. PATENT DOCUMENTS 7,425,762 B2 *   9/2008  Hasebe ................ H01L 23/142
                                                           257/707
2011/0036627 A1 * 2/2011  Loibl .................. H01R 43/0221
                                                           174/549
(Continued)

FOREIGN PATENT DOCUMENTS

JP    2015-047031 A    3/2015
JP    2015-104168 A    6/2015
(Continued)

OTHER PUBLICATIONS

Official Communication issued in International Patent Application No. PCT/JP2018/006558, dated May 15, 2018.

*Primary Examiner* — Sherman Ng
(74) *Attorney, Agent, or Firm* — Keating & Bennett

(57) ABSTRACT

A circuit board includes a circuit board main body including a first through hole, and a first inlay member inserted into the first through hole. The first inlay member includes a first end surface, one surface of the circuit board main body includes a first through hole peripheral portion located around the first through hole, a first conductive pattern is located around the first through hole peripheral portion, the first through hole peripheral portion includes a first pattern exposed area where the first conductive pattern is exposed, and a first pattern non-exposed area where the first conductive pattern is covered with a resist, and the first end surface and the first pattern exposed area are a first mount pad to which a first terminal of an electronic component is connected.

14 Claims, 5 Drawing Sheets

(51) Int. Cl.
  *H02K 11/33* (2016.01)
  *F04B 35/04* (2006.01)
  *H02K 5/20* (2006.01)
  *H02K 9/19* (2006.01)
  *H02K 9/22* (2006.01)
  *H05K 1/11* (2006.01)
  *H05K 1/18* (2006.01)

(52) U.S. Cl.
  CPC ............... *H02K 9/22* (2013.01); *H02K 11/27* (2016.01); *H02K 11/33* (2016.01); *H05K 1/115* (2013.01); *H05K 1/181* (2013.01); *H02K 2211/03* (2013.01); *H05K 2201/066* (2013.01); *H05K 2201/10022* (2013.01); *H05K 2201/10151* (2013.01)

(58) Field of Classification Search
  USPC ........................................................ 361/719
  See application file for complete search history.

(56) References Cited

U.S. PATENT DOCUMENTS

| | | |
|---|---|---|
| 2011/0096495 A1 | 4/2011 | Heise |
| 2013/0328424 A1 | 12/2013 | Goto |
| 2016/0143126 A1 | 5/2016 | Taneko et al. |
| 2018/0183160 A1* | 6/2018 | Shiomi .................. H05K 1/181 |
| 2018/0241285 A1* | 8/2018 | Sasaki .................... H05K 1/144 |

FOREIGN PATENT DOCUMENTS

| | | |
|---|---|---|
| WO | 2013/008266 A1 | 1/2013 |
| WO | 2014/199456 A1 | 12/2014 |

* cited by examiner

CIRCUIT BOARD, MOTOR, CONTROLLER, AND ELECTRIC PUMP

CROSS REFERENCE TO RELATED APPLICATIONS

This is a U.S. national stage of PCT Application No. PCT/JP2018/006558, filed on Feb. 22, 2018, and priority under 35 U.S.C. § 119(a) and 35 U.S.C. § 365(b) is claimed from Japanese Application No. 2017-033856, filed Feb. 24, 2017; the entire disclosures of which are hereby incorporated herein by reference.

FIELD OF THE INVENTION

The present disclosure relates to a circuit board, a motor, a controller, and an electric pump.

BACKGROUND

Conventionally, a technique has been known in which an inlay component is press-fit into a press-fit hole of a circuit board to improve heat dissipation of a circuit structure through the inlay component and a bus bar (see JP 2015-047031 A, for example). The circuit structure disclosed in JP 2015-047031 A includes a metal inlay component, a bus bar made of a plate-like metal, and a circuit board in which a conductive path is formed in an insulating plate. The bus bar has a press-fit hole into which the inlay component is press-fit. The conductive path is connected to the inlay component.

In the circuit structure of JP 2015-047031 A, a terminal of an electronic component is connected to the inlay component, but is not connected to a conductive pattern formed on the circuit board. Hence, a current cannot flow between the electronic component and the conductive pattern formed on the circuit board without passing through the inlay component. As a result, in the circuit structure of JP 2015-047031 A, a large current is not allowed to flow between the electronic component and the conductive pattern formed on the circuit board.

SUMMARY

In view of the foregoing, example embodiments provide circuit boards, motors, controllers, and electric pumps that each transfer heat from an electronic component mounted on a circuit board to an end surface of an inlay member, and allow a current to flow from the electronic component to a conductive pattern on the circuit board.

A circuit board according to an example embodiment of the present disclosure includes a circuit board main body including a first through hole, and a first inlay member inserted into the first through hole. The first inlay member includes a first end surface. One surface of the circuit board main body includes a first through hole peripheral portion located around the first through hole. A first conductive pattern is located around the first through hole peripheral portion. The first through hole peripheral portion includes a first pattern exposed area where the first conductive pattern is exposed, and a first pattern non-exposed area where the first conductive pattern is covered with a resist. The first end surface and the first pattern exposed area are a first mount pad to which a first terminal of an electronic component is connected.

According to example embodiments of the present disclosure, it is possible to provide circuit boards, motors, controllers, and electric pumps that each transfer heat from an electronic component mounted on a circuit board to an end surface of an inlay member, and allow a current to flow from the electronic component to a conductive pattern on the circuit board.

The above and other elements, features, steps, characteristics and advantages of the present disclosure will become more apparent from the following detailed description of the example embodiments with reference to the attached drawings.

DETAILED DESCRIPTION

First Example Embodiment

Figure 1A:
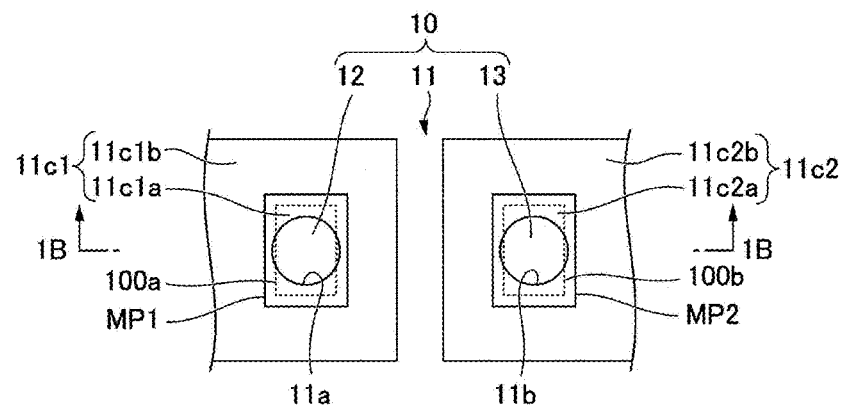
FIG. 1A is a plan view of a main portion of a circuit board of a first example embodiment of the present disclosure.
Figure 1B:
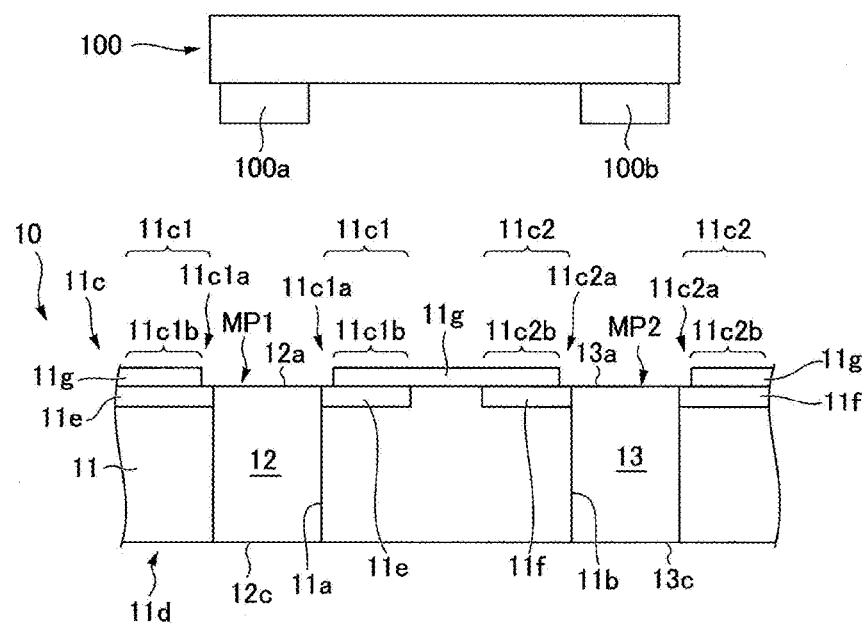
FIG. 1B is a schematic cross-sectional view taken along line 1B-1B of FIG. 1A.

FIG. 1A is a plan view of a main part of a circuit board 10 of a first example embodiment of the present disclosure. FIG. 1B is a schematic cross-sectional view taken along line 1B-1B of FIG. 1A. Specifically, FIG. 1B is a diagram for explaining a relationship between a first terminal 100a and a first mount pad MP1 and a relationship between a second terminal 100b and a second mount pad MP2 in the first example embodiment. As shown in FIGS. 1A and 1B, the circuit board 10 of the first example embodiment includes the circuit board main body 11, the first inlay member 12 having a cylindrical shape, for example, and the second inlay member 13 having a cylindrical shape, for example. The circuit board main body 11 has a first through hole 11a, a second through hole 11b, one surface 11c, and the other surface 11d. The first inlay member 12 is inserted into the first through hole 11a. The second inlay member 13 is inserted into the second through hole 11b. The first inlay member 12 and the second inlay member 13 are made of a metal such as copper, for example.

In the circuit board 10 of the first example embodiment, the first inlay member 12 is fixed to the circuit board main body by press-fitting the first inlay member 12 into the first through hole 11a. Similarly, the second inlay member 13 is fixed to the circuit board main body 11 by press-fitting the second inlay member 13 into the second through hole 11b.

As shown in FIG. 1B, the first inlay member 12 has a first end face 12a and a second end face 12c. The second inlay member 13 has a first end face 13a and a second end face 13c.

As shown in FIGS. 1A and 1B, the one surface 11c of the circuit board main body 11 has a first through hole peripheral portion 11c1 located around the first through hole 11a. A first conductive pattern 11e is formed in the first through hole peripheral portion 11c1. The first through hole peripheral portion 11c1 has a first pattern exposed area 11c1a where the first conductive pattern 11e is exposed. Moreover, the first through hole peripheral portion 11c1 has a first pattern non-exposed area 11c1b where the first conductive pattern 11e is covered with a resist 11g. The first end face 12a of the first inlay member 12 and the first pattern exposed area 11c1a of the one surface 11c of the circuit board main body 11 are the first mount pad MP1 to which the first terminal 100a of the electronic component 100 is connected.

Further, as shown in FIGS. 1A and 1B, the one surface 11c of the circuit board main body 11 has a second through hole peripheral portion 11c2 located around the second through hole 11b. A second conductive pattern 11f is formed in the second through hole peripheral portion 11c2. The second through hole peripheral portion 11c2 has a second pattern exposed area 11c2a where the second conductive pattern 11f is exposed. The second through hole peripheral portion 11c2 has a second pattern non-exposed area 11c2b where the second conductive pattern 11f is covered with the resist 11g. The first end face 13a of the second inlay member 13 and the second pattern exposed area 11c2a of the one surface 11c of the circuit board main body 11 are the second mount pad MP2 to which the second terminal 100b of the electronic component 100 is connected.

That is, in the circuit board 10 of the first example embodiment, the first terminal 100a of the electronic component 100 is connected to the first end face 12a of the first inlay member 12 through solder, for example. Further, the second terminal 100b of the electronic component 100 is connected to the first end face 13a of the second inlay member 13 through solder, for example. Accordingly, in the circuit board 10 of the first example embodiment, heat generated by the electronic component 100 can be passed to the first end face 12a of the first inlay member and the first end face 13a of the second inlay member 13. Further, in the circuit board 10 of the first example embodiment, the first terminal 100a of the electronic component 100 is connected to the first pattern exposed area 11c1a of the one surface 11c of the circuit board main body 11 through solder, for example. In addition, the second terminal 100b of the electronic component 100 is connected to the second pattern exposed area 11c2a of the one surface 11c of the circuit board main body 11 through solder, for example. Accordingly, in the circuit board 10 of the first example embodiment, a current is allowed to flow from the first conductive pattern 11e of the circuit board main body 11 to the second conductive pattern 11f of the circuit board main body through the electronic component 100, or from the second conductive pattern 11f of the circuit board main body 11 to the first conductive pattern 11e of the circuit board main body 11 through the electronic component 100.

Figure 2A:
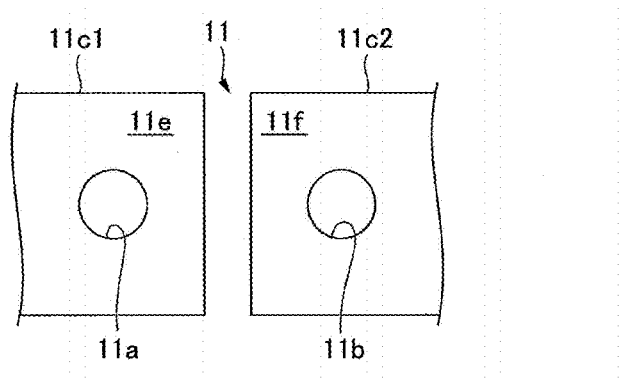
FIG. 2A is a diagram for explaining a manufacturing process of the circuit board of the first example embodiment of the present disclosure.
Figure 2B:
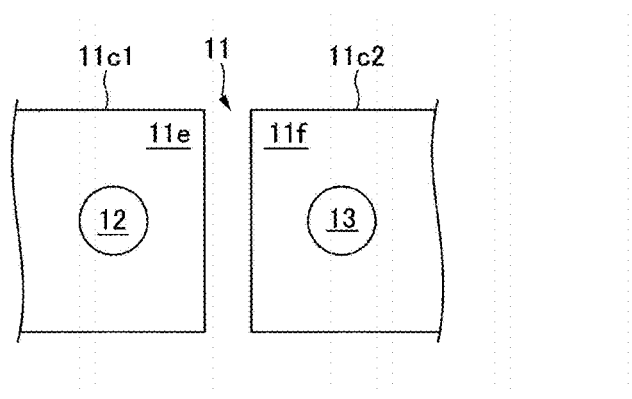
FIG. 2B is a diagram for explaining the manufacturing process of the circuit board of the first example embodiment of the present disclosure.
Figure 2C:
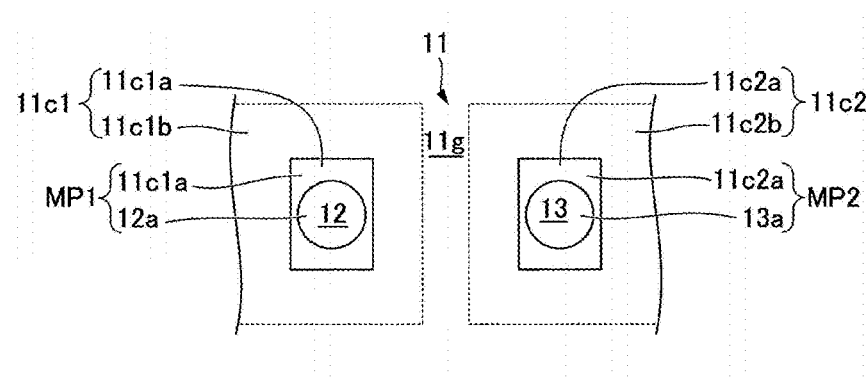
FIG. 2C is a diagram for explaining the manufacturing process of the circuit board of the first example embodiment of the present disclosure.

FIGS. 2A, 2B, and 2C are diagrams for explaining a manufacturing process of the circuit board 10 of the first example embodiment.

In the example of manufacturing the circuit board 10 of the first example embodiment shown in FIGS. 2A, 2B, and 2C, first, as shown in FIG. 2A, the first through hole 11a and the second through hole 11b are formed in the circuit board main body 11. Further, copper plating (not shown) including the first conductive pattern 11e and the second conductive pattern 11f is formed on the circuit board main body 11.

Next, as shown in FIG. 2B, the first inlay member 12 is inserted into the first through hole 11a of the circuit board main body 11. Additionally, the second inlay member 13 is inserted into the second through hole 11b of the circuit board main body 11. Next, circuit forming processing is performed to form the outline of the first conductive pattern 11e and the second conductive pattern 11f as shown in FIG. 2B. Next, as shown in FIG. 2C, the resist 11g is formed on the circuit board main body 11. Specifically, a part of the first conductive pattern 11e is covered with the resist 11g. As a result, a first pattern non-exposed area 11c1b is formed. A portion of the first conductive pattern 11e not covered with the resist 11g is the first pattern exposed area 11c1a. In addition, a part of the second conductive pattern 11f is covered with the resist 11g. As a result, a second pattern non-exposed area 11c2b is formed. A portion of the second conductive pattern 11f not covered by the resist 11g is the second pattern exposed area 11c2a. Further, the first mount pad MP1 is formed of the first end face 12a of the first inlay member 12 and the first pattern exposed area 11c1a of the circuit board main body 11. Further, the second mount pad MP2 is formed of the first end face 13a of the second inlay member 13 and the second pattern exposed area 11c2a of the circuit board main body 11. In the example shown in FIGS. 2A, 2B and 2C, after the first inlay member 12 is inserted into the first through hole 11a and the second inlay member 13 is inserted into the second through hole 11b, the resist 11g is formed. Alternatively, in another example, the first inlay member 12 may be inserted into the first through hole 11a of the circuit board main body 11 and the second inlay member 13 may be inserted into the second through hole 11b of the circuit board main body 11 after the resist 11g is formed on the circuit board main body 11.

In the example shown in FIGS. 1A and 1B, the electronic component 100 is mounted on the circuit board 10. Specifically, the first terminal 100a of the electronic component 100 is disposed on the first mount pad MP1 of the circuit board 10. The first terminal 100a and the first mount pad MP1 are connected by solder, for example. In addition, the second terminal 100b of the electronic component 100 is disposed on the second mount pad MP2 of the circuit board 10. The second terminal 100b and the second mount pad MP2 are connected by solder, for example.

In the circuit board 10 of the first example embodiment, the first pattern exposed area 11c1a is provided in the first mount pad MP1 and the second pattern exposed area 11c2a is provided in the second mount pad MP2. Hence, as compared to a case where the first pattern exposed area 11c1a and the second pattern exposed area 11c2a are not provided in the circuit board main body 11, a current path between the electronic component 100 mounted on the circuit board 10 and the circuit board 10 can be secured more reliably. Further, as compared to a case where the first pattern exposed area 11c1a and the second pattern exposed area 11c2a are not provided in the circuit board main body 11, the fillet of the solder connecting the circuit board 10 and the electronic component 100 can be formed in a more ideal shape. That is, the connectivity between the circuit board 10 and the electronic component 100 can be improved, and soldering defects can be reduced, for example.

Specifically, in the example shown in FIG. 1A, a part of the first terminal 100a is disposed on the first pattern exposed area 11c1a of the circuit board main body 11. Hence, as compared to a case where the first terminal 100a is not disposed on the first pattern exposed area 11c1a of the circuit board main body 11, a current path between the first terminal 100a and the circuit board main body 11 can be secured more reliably. Further, in the example shown in FIG. 1A, a part of the second terminal 100b is disposed on the second pattern exposed area 11c2a of the circuit board main body 11. Hence, as compared to a case where the second terminal 100b is not disposed on the second pattern exposed area 11c2a of the circuit board main body 11, a current path between the second terminal 100b and the circuit board main body 11 can be secured more reliably.

As described above, in the example shown in FIGS. 1A and 1B, the cylindrical first inlay member 12 is press-fit into the first through hole 11a, and the cylindrical second inlay member 13 is press-fit into the second through hole 11b. Hence, the burden on the circuit board main body 11 can be reduced compared to a case where a non-cylindrical inlay member is press-fit into the through hole. Moreover, in the example shown to FIGS. 1A and 1B, a spacing between the first through hole 11a and the second through hole 11b of the circuit board main body 11 is 3 mm or more. Hence, deformation of the circuit board 10 at the time of press-fitting of the first inlay member 12 or the second inlay member 13 can be suppressed.

In the example shown in FIGS. 1A and 1B, the circuit board 10 includes the electronic component 100. Additionally, the electronic component 100 is a current sensing resistor. For example, the current sensing resistor is a shunt resistor. In another example, an electronic component other than the current sensing resistor, or an electronic component other than the shunt resistor may be mounted on the circuit board 10 as the electronic component 100. In the example shown in FIGS. 1A and 1B, the cylindrical first inlay member 12 and second inlay member 13 are used. However, in other examples, a non-cylindrical first inlay member 12 and second inlay member 13 may be used. In the example shown in FIGS. 1A and 1B, the first inlay member 12 and the second inlay member 13 are press-fit. However, in other examples, the first inlay member 12 and the second inlay member 13 may be fixed to the circuit board main body 11 by methods other than press-fitting such as caulking.

Second Example Embodiment

A circuit board 10 of a second example embodiment of the present disclosure is configured in a similar manner as the circuit board 10 of the first example embodiment except for the points described below. Hence, the circuit board 10 of the second example embodiment can exhibit effects similar to those of the circuit board 10 of the first example embodiment except for the points described below.

Figure 3A:
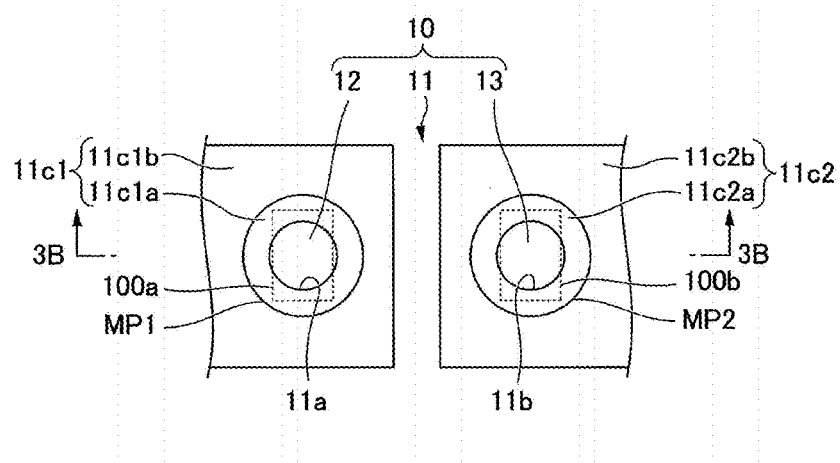
FIG. 3A is a plan view of a main portion of a circuit board of a second example embodiment of the present disclosure.
Figure 3B:
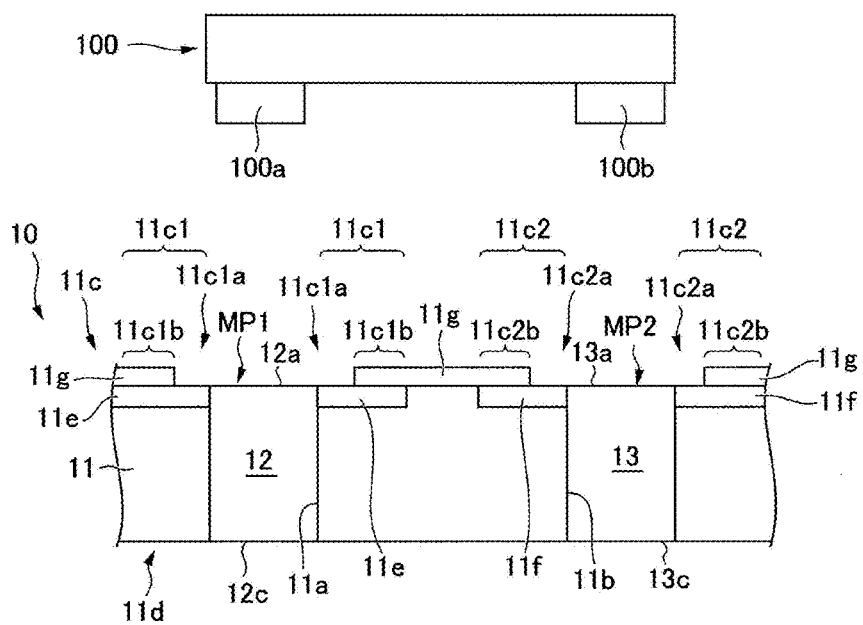
FIG. 3B is a schematic cross-sectional view taken along line 3B-3B of FIG. 3A.
Figure 4A:
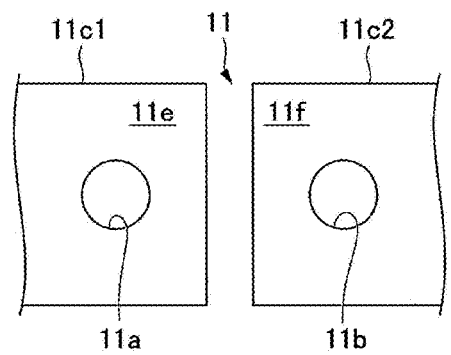
FIG. 4A is a diagram for explaining a manufacturing process of the circuit board of the second example embodiment of the present disclosure.
Figure 4B:
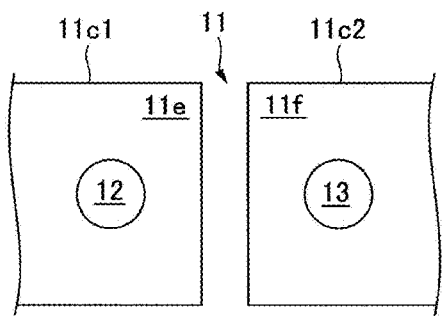
FIG. 4B is a diagram for explaining the manufacturing process of the circuit board of the second example embodiment of the present disclosure.
Figure 4C:
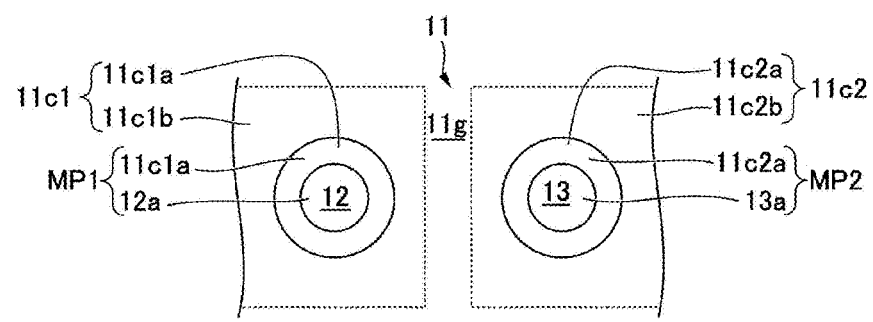
FIG. 4C is a diagram for explaining the manufacturing process of the circuit board of the second example embodiment of the present disclosure.

FIG. 3A is a plan view of a main part of the circuit board 10 according to the second example embodiment. FIG. 3B is a schematic cross-sectional view taken along line 3B-3B of FIG. 3A. Specifically, FIG. 3B is a diagram for explaining a relationship between a first terminal 100a and a first mount pad MP1 and a relationship between a second terminal 100b and a second mount pad MP2 in the second example embodiment. FIGS. 4A, 4B, and 4C are diagrams for explaining a manufacturing process of the circuit board 10 of the second example embodiment.

In the example of manufacturing the circuit board 10 of the second example embodiment shown in FIGS. 4A, 4B, and 4C, first, as shown in FIG. 4A, a first through hole 11a and a second through hole 11b are formed in a circuit board main body 11. Further, copper plating (not shown) including the first conductive pattern 11e and the second conductive pattern 11f is formed on the circuit board main body 11. Next, as shown in FIG. 4B, a first inlay member 12 is inserted into the first through hole 11a of the circuit board main body 11. Additionally, the second inlay member 13 is inserted into the second through hole 11b of the circuit board main body 11. Next, circuit forming processing is performed to form the outline of the first conductive pattern 11e and the second conductive pattern 11f as shown in FIG. 4B. Next, as shown in FIG. 4C, a resist 11g is formed on the circuit board main body 11. Specifically, a part of the first conductive pattern 11e is covered with the resist 11g. As a result, a first pattern non-exposed area 11c1b is formed. A portion of the first conductive pattern 11e not covered with the resist 11g is the first pattern exposed area 11c1a. In the example of the circuit board 10 of the first example embodiment shown in FIG. 2C, the boundary between the first pattern exposed area 11c1a and the first pattern non-exposed area 11c1b is rectangular. On the other hand, in the example of the circuit board 10 of the second example embodiment shown in FIG. 4C, the boundary between the first pattern exposed area 11c1a and the first pattern non-exposed area 11c1b is circular. Further, as shown in FIG. 4C, a part of the second conductive pattern 11f is covered with the resist 11g. As a result, a second pattern non-exposed area 11c2b is formed. A portion of the second conductive pattern 11f not covered by the resist 11g is the second pattern exposed area 11c2a. In the example of the circuit board 10 of the first example embodiment shown in FIG. 2C, the boundary between the second pattern exposed area 11c2a and the second pattern non-exposed area 11c2b is rectangular. On the other hand, in the example of the circuit board 10 of the second example embodiment shown in FIG. 4C, the boundary between the second pattern exposed area 11c2a and the second pattern non-exposed area 11c2b is circular.

Further, as shown in FIG. 4C, the first mount pad MP1 is formed of the first end face 12a of the first inlay member 12 and the first pattern exposed area 11c1a of the circuit board main body 11. In the example of the circuit board 10 of the first example embodiment shown in FIG. 2C, the rectangular first mount pad MP1 is formed. On the other hand, in the example of the circuit board 10 of the second example embodiment shown in FIG. 4C, the circular first mount pad MP1 is formed. Further, as shown in FIG. 4C, the second mount pad MP2 is formed of the first end face 13a of the second inlay member 13 and the second pattern exposed area 11c2a of the circuit board main body 11. In the example of the circuit board 10 of the first example embodiment shown in FIG. 2C, the rectangular second mount pad MP2 is formed. On the other hand, in the example of the circuit board 10 of the second example embodiment shown in FIG. 4C, the circular second mount pad MP2 is formed.

That is, in the circuit board 10 of the first example embodiment, as shown in FIGS. 1A and 2C, the first mount pad MP1 and the second mount pad MP2 are formed in a rectangular shape. On the other hand, in the circuit board 10 of the second example embodiment, as shown in FIGS. 3A and 4C, the first mount pad MP1 and the second mount pad MP2 are formed in a circular shape. In the example shown in FIGS. 4A, 4B and 4C, after the first inlay member 12 is inserted into the first through hole 11a and the second inlay member 13 is inserted into the second through hole 11b, the resist 11g is formed. Alternatively, in another example, the first inlay member 12 may be inserted into the first through hole 11a of the circuit board main body 11 and the second inlay member 13 may be inserted into the second through hole 11b of the circuit board main body 11 after the resist 11g is formed on the circuit board main body 11.

Specifically, in the example shown in FIG. 3A, a part of the first terminal 100a having a rectangular horizontal section is disposed on the annular first pattern exposed area 11c1a located outside the first end face 12a. Hence, as compared to a case where the first terminal 100a is not disposed on the first pattern exposed area 11c1a of the circuit board main body 11, a current path between the first terminal 100a and the circuit board main body 11 can be secured more reliably. Moreover, in the example shown in FIG. 3A, a part of the second terminal 100b having a rectangular horizontal section is disposed on the annular second pattern exposed area 11c2a located outside the first end face 13a. Hence, as compared to a case where the second terminal 100b is not disposed on the second pattern exposed area 11c2a of the circuit board main body 11, a current path between the second terminal 100b and the circuit board main body 11 can be secured more reliably.

First Application Example

Figure 5:
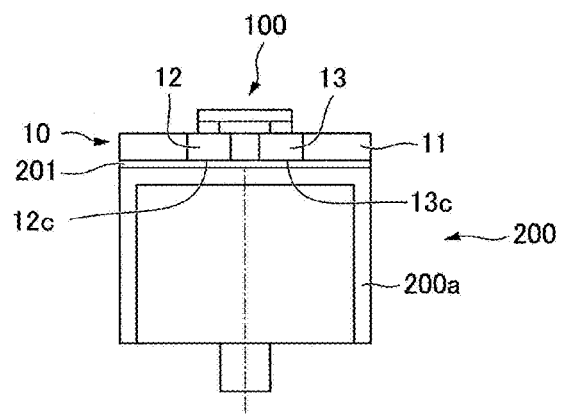
FIG. 5 is a diagram showing a motor to which the circuit board of the first or second example embodiment of the present disclosure is applied.

In the example shown in FIG. 5, the circuit board 10 of the first or second example embodiment is applied to a motor 200, and functions as a control circuit board for driving the motor 200. That is, in the example shown in FIG. 5, the motor 200 includes the circuit board 10 and a motor housing 200a. The circuit board 10 is connected to the motor housing 200a through an electrical insulating member 201. That is, a second end face 12c of a first inlay member 12 and a second end face 13c of a second inlay member 13 are connected to the motor housing 200a through the electrical insulating member 201. Accordingly, a part of heat generated by an electronic component 100 is transferred to the motor housing 200a through the first inlay member 12 and the electrical insulating member 201. Further, another part of the heat generated by the electronic component 100 is transferred to the motor housing 200a through the second inlay member 13 and the electrical insulating member 201. The heat transferred to the motor housing 200a is dissipated from the motor housing 200a. As a result, overheating of the electronic component 100 can be suppressed.

In the example shown in FIG. 5, the electronic component 100 is a resistor used for overcurrent detection, current control, current management, and the like. Specifically, the electronic component 100 is a shunt resistor that detects the value of a current flowing through a field effect transistor forming an inverter. The shunt resistor generates heat due to the large current flowing through the shunt resistor. The heat generated by the shunt resistor is transferred to the motor housing 200a through the first inlay member 12 and the second inlay member 13, and is dissipated from the motor housing 200a. Hence, the motor 200 to which the circuit board 10 of the first or second example embodiment is applied can suppress overheating of the shunt resistor as the electronic component 100.

Second Application Example

Figure 6:
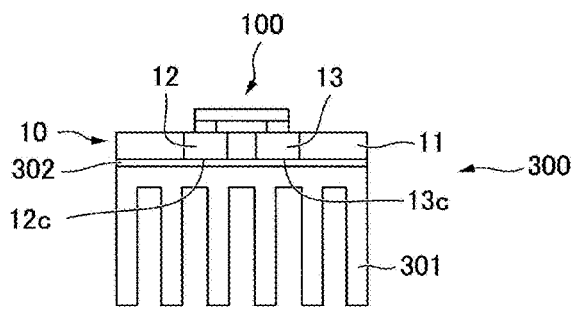
FIG. 6 is a diagram showing a controller to which the circuit board of the first or second example embodiment of the present disclosure is applied.

In the example shown in FIG. 6, the circuit board 10 of the first or second example embodiment is applied to a controller 300. That is, in the example shown in FIG. 6, the controller 300 includes the circuit board 10 and a heat sink 301. The circuit board 10 is connected to the heat sink 301 through an electrical insulating member 302. That is, a second end face 12c of a first inlay member 12 and a second end face 13c of a second inlay member are connected to the heat sink 301 through the electrical insulating member 302. Accordingly, a part of heat generated by an electronic component 100 is transferred to the heat sink 301 through the first inlay member 12 and the electrical insulating member 302. Further, another part of the heat generated by the electronic component 100 is transferred to the heat sink 301 through the second inlay member 13 and the electrical insulating member 302. The heat transferred to the heat sink 301 is dissipated from a fin portion or the like of the heat sink 301. As a result, overheating of the electronic component 100 can be suppressed.

Third Application Example

Figure 7:
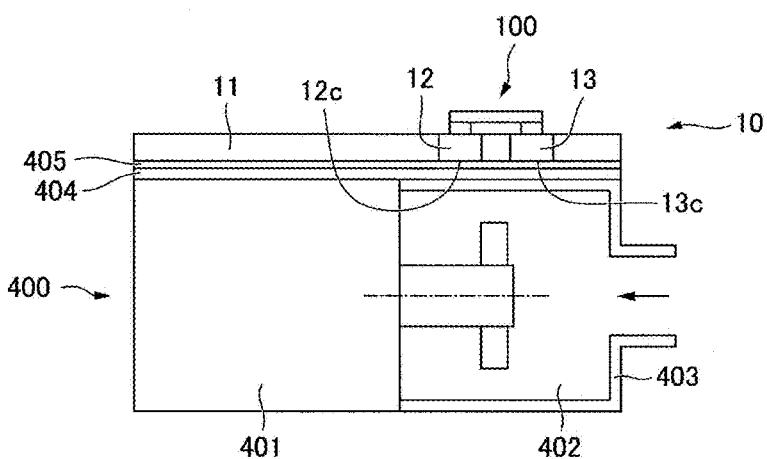
FIG. 7 is a diagram showing an electric pump to which the circuit board of the first or second example embodiment of the present disclosure is applied.

In the example shown in FIG. 7, the circuit board 10 of the first or second example embodiment is applied to an electric pump 400, and functions as a control circuit board for driving an electric pump motor 401. That is, in the example shown in FIG. 7, the electric pump 400 includes the circuit board 10, the electric pump motor 401, and a housing 403 having a flow path 402. The circuit board 10 is connected to the housing 403 through an electrical insulating member 405 and a heat sink 404. That is, a second end face 12c of a first inlay member 12 and a second end face 13c of a second inlay member 13 are connected to the housing 403 through the electrical insulating member 405 and the heat sink 404. Accordingly, a part of heat generated by an electronic component 100 is transferred to the housing 403 through the first inlay member 12, the electrical insulating member 405, and the heat sink 404. Further, another part of the heat generated by the electronic component 100 is transferred to the housing 403 through the second inlay member 13, the electrical insulating member 405, and the heat sink 404. The housing 403 is cooled by water or oil in the flow path 402. As a result, overheating of the electronic component 100 can be suppressed.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A circuit board comprising: a circuit board main body including a first through hole; and a first inlay member inserted into the first through hole; wherein the first inlay member includes a first end surface; one surface of the circuit board main body includes a first through hole peripheral portion located around the first through hole; a first conductive pattern is located around the first through hole peripheral portion; the first through hole peripheral portion includes a first pattern exposed area where the first conductive pattern is exposed, and a first pattern non-exposed area where the first conductive pattern is covered with a resist; and the first end surface and the first pattern exposed area are a first mount pad to which a first terminal of an electronic component is connected, wherein the circuit board main body includes a second through hole; the circuit board further includes a second inlay member inserted into the second through hole; the second inlay member includes a first end surface; the one surface includes a second through hole peripheral portion located around the second through hole; a second conductive pattern is located around the second through hole peripheral portion; the second through hole peripheral portion includes a second pattern exposed area where the second conductive pattern is exposed, and a second pattern non-exposed area where the second conductive pattern is covered with the resist; and the first end surface of the second inlay member and the second pattern exposed area are a second mount pad to which a second terminal of the electronic component is connected.

2. The circuit board according to claim 1, wherein a spacing between the first through hole and the second through hole is about 3 mm or more.

3. The circuit board according to claim 2, wherein the circuit board includes the electronic component; and the electronic component includes a current sensing resistor.

4. The circuit board according to claim 3, wherein the current sensing resistor includes a shunt resistor.

5. The circuit board according to claim 1, wherein the first inlay member and the second inlay member have a cylindrical shape; the first inlay member is press-fit into the first through hole; and the second inlay member is press-fit into the second through hole.

6. A motor comprising: the circuit board according to claim 1; and a motor housing; wherein a second end surface of the first inlay member and a second end surface of the second inlay member are connected to the motor housing.

7. A controller comprising: the circuit board according to claim 1; and a heat sink; wherein a second end surface of the first inlay member and a second end surface of the second inlay member are connected to the heat sink.

8. An electric pump comprising: the circuit board according to claim 1; an electric pump motor; and a housing including a flow path; wherein a second end surface of the first inlay member and a second end surface of the second inlay member are connected to the housing.

9. The circuit board according to claim 2, wherein the first inlay member and the second inlay member have a cylindrical shape; the first inlay member is press-fit into the first through hole; and the second inlay member is press-fit into the second through hole.

10. The circuit board according to claim 3, wherein the first inlay member and the second inlay member have a cylindrical shape; the first inlay member is press-fit into the first through hole; and the second inlay member is press-fit into the second through hole.

11. The circuit board according to claim 4, wherein the first inlay member and the second inlay member have a cylindrical shape; the first inlay member is press-fit into the first through hole; and the second inlay member is press-fit into the second through hole.

12. A motor comprising: the circuit board according to claim 5; and a motor housing; wherein a second end surface of the first inlay member and a second end surface of the second inlay member are connected to the motor housing.

13. A controller comprising: the circuit board according to claim 5; and a heat sink; wherein a second end surface of the first inlay member and a second end surface of the second inlay member are connected to the heat sink.

14. An electric pump comprising: the circuit board according to claim 5; an electric pump motor; and a housing including a flow path; wherein a second end surface of the first inlay member and a second end surface of the second inlay member are connected to the housing.

* * * * *